United States Patent

Kawakami et al.

[11] Patent Number: 5,847,326
[45] Date of Patent: Dec. 8, 1998

[54] LOW-TEMPERATURE FIRED CERAMIC CIRCUIT SUBSTRATE WITH IMPROVED AG-AU CONNECTION RELIABILITY

[75] Inventors: Katsuya Kawakami, Toyoake; Junzo Fukuta, Nagoya, both of Japan

[73] Assignee: Sumitomo Metal Electronics Devices Inc., Mine, Japan

[21] Appl. No.: 808,019

[22] Filed: Mar. 3, 1997

[30] Foreign Application Priority Data

Mar. 11, 1996 [JP] Japan .................................. 8-052759

[51] Int. Cl.$^6$ ........................................ H05K 1/02
[52] U.S. Cl. ........................... 174/256; 174/261; 361/779
[58] Field of Search ..................................... 428/901, 209; 174/256, 257, 258, 255, 261; 361/792, 793, 794, 795, 779, 780; 427/96, 125

[56] References Cited

U.S. PATENT DOCUMENTS

| | | | |
|---|---|---|---|
| 4,081,901 | 4/1978 | Miller | 427/96 |
| 4,621,066 | 11/1986 | Nishigaki et al. | 501/128 |
| 5,084,323 | 1/1992 | Nagasaka et al. | 428/137 |
| 5,665,459 | 9/1997 | Fukuta et al. | 428/209 |

FOREIGN PATENT DOCUMENTS

| | | |
|---|---|---|
| 0 247 617 | 12/1987 | European Pat. Off. . |
| 2 222 911 | 3/1990 | United Kingdom . |

*Primary Examiner*—Bot L. Ledynh
*Assistant Examiner*—Kristina Soderquist
*Attorney, Agent, or Firm*—Foley & Lardner

[57] ABSTRACT

A low-temperature fired ceramic circuit substrate includes a plurality of laminated insulating layers each formed of a low-temperature fired ceramic fired at a temperature ranging between 800 and 1,000° C., an inside layer wiring conductor formed of a conductive material of Ag system which is mainly composed of Ag, the inside layer wiring conductor being disposed in the inside insulating layer, a surface layer wiring conductor formed of a conductive material of Au system which is mainly composed of Au, the surface layer wiring conductor being disposed on the surface insulating layer, and an intermediate metal layer formed of a thick film paste of a conductive material of Au/Ag system which is mainly composed of Au/Ag, the intermediate metal layer being interposed between the inside layer wiring conductor and the surface layer wiring conductor.

9 Claims, 2 Drawing Sheets

LOW-TEMPERATURE FIRED CERAMIC CIRCUIT SUBSTRATE WITH IMPROVED AG-AU CONNECTION RELIABILITY

BACKGROUND OF THE INVENTION

1. Field of the Invention

This invention relates to a low-temperature fired ceramic circuit substrate in which a conductor of Ag system (hereinafter, "Ag conductor") is used as wiring conductors disposed in inside layers of the substrate. The Ag conductor includes Ag/Pd, Ag/Pt, and Ag/Pd/Pt conductors as well as the Ag conductor.

2. Description of the Prior Art

A wiring conductor of Ag system (hereinafter, "Ag wiring conductor") has good electric characteristics such as a low conductive resistance. However, since the Ag wiring conductor has a melting point lower than a firing temperature (about 1,600° C.) of general ceramic substrates such as an alumina substrate, the Ag wiring conductor cannot be used for the alumina substrate. Tungsten (W) or molybdenum (Mo) each having a higher melting point has been used as the wiring conductors for the alumina substrate. However, these metals with high melting points have high conductive resistances and need to be fired at high temperatures in a reducing atmosphere in order to inhibit oxidation.

To overcome the above-described drawbacks, U.S. Pat. No. 4,621,066 discloses a low-temperature fired ceramic substrate which can be fired in an oxidizing atmosphere at a temperature between 800° and 1,000° C., i.e., at or below the melting point of the Ag wiring conductor. The Ag wiring conductor is co-fired with the low-temperature fired ceramic circuit substrate. The Ag wiring conductor causes migration under specific conditions, whereas electrode portions and the like on the surface of the substrate require migration-proofing. Accordingly, a film of Au system conductor superior in migration-proofing needs to be formed on the Ag conductor of the electrode portions, which Au system conductor will hereinafter be referred to as "Au conductor" throughout the description. However, when the Ag conductor is fired with the Au conductor being connected directly thereto, the Kirkendall effect causes Ag atoms to diffuse into the Au conductor, which results in a number of voids formed in boundary faces. Consequently, the reliability in a connection between the Ag and Au conductors is reduced.

To solve the above-described problem, European Patent Publication No. 0247617 discloses an intermediate layer of metal such as Ni, Cr, or Ti. The intermediate metal layer is formed between the Ag and Au conductors by means of electroless plating for preventing diffusion of the Ag atoms into the Au conductor so that the reliability in the connection between the Ag and Au conductors is enhanced.

Resistors of $RuO_2$ system, overcoat glass, surface layer wiring conductors of Ag system and so on are attached to the surface layer of the substrate after the Au conductor printed on the intermediate metal layer is fired. For this purpose, the printing and the firing are sometimes repeated alternately. However, the repeated firing sometimes expands the intermediate metal layer of the conventional substrate, resulting in breakage or disconnection in a connection between the Ag and Au conductors, which connection will hereinafter be referred to as "Ag-Au connection." The conventional low-temperature fired ceramic substrate is thus defective in the reliability in the Ag-Au connection against the repeated firing. Penetration of a plating liquid into the inside layer Ag conductor would be one of causes for the expansion of the intermediate metal layer.

SUMMARY OF THE INVENTION

Therefore, an object of the present invention is to provide a low-temperature fired ceramic circuit substrate which has an improved reliability in the Ag-Au connection thereof against repeated firing.

To achieve the object, the present invention provides a low-temperature fired ceramic circuit substrate comprising a plurality of laminated insulating layers each formed of a low-temperature fired ceramic fired at a temperature ranging between 800° and 1,000° C., an inside layer wiring conductor formed of a conductive material of Ag system which is mainly composed of Ag, the inside layer wiring conductor being disposed in the inside insulating layer, and a surface layer wiring conductor formed of a conductive material of Au system which is mainly composed of Au, the surface layer wiring conductor being disposed on the surface insulating layer. An intermediate metal layer is formed of a thick film paste of a conductive material of Au/Ag system which is mainly composed of Au/Ag. The intermediate metal layer is interposed between the inside layer wiring conductor and the surface layer wiring conductor, thereby connecting both Ag and Au conductors together.

The Ag conductive material preferably consists of Ag, Ag/Pd, Ag/Pt or Ag/Pd/Pt. The Au conductive material preferably consists of Au, Au/Pt or Au/Pd. The Au/Ag conductive material preferably contains 10 to 80 weight percentage of Au and 90 to 20 weight percentage of Ag.

According to the above-described low-temperature fired ceramic circuit substrate, the intermediate metal layer is formed of the thick film paste of Au/Ag system. The intermediate metal layer prevents penetration of a plating liquid into the Ag inside layer wiring conductor which would be one of the causes for the expansion of the intermediate metal layer. Accordingly, repeated firing does not tend to result in breakage or disconnection in the Ag-Au connection. Consequently, since a percent defective of the Ag-Au connection against the repeated firing is reduced to a large extent as compared with the prior art, the reliability in the Ag-Au connection against the repeated firing can be improved.

BRIEF DESCRIPTION OF THE DRAWINGS

Other objects, features and advantages of the present invention will become clear upon reviewing the following description of preferred embodiments thereof, made with reference to the accompanying drawings, in which.

DETAILED DESCRIPTION OF THE PREFERRED EMBODIMENT

Figure 1:
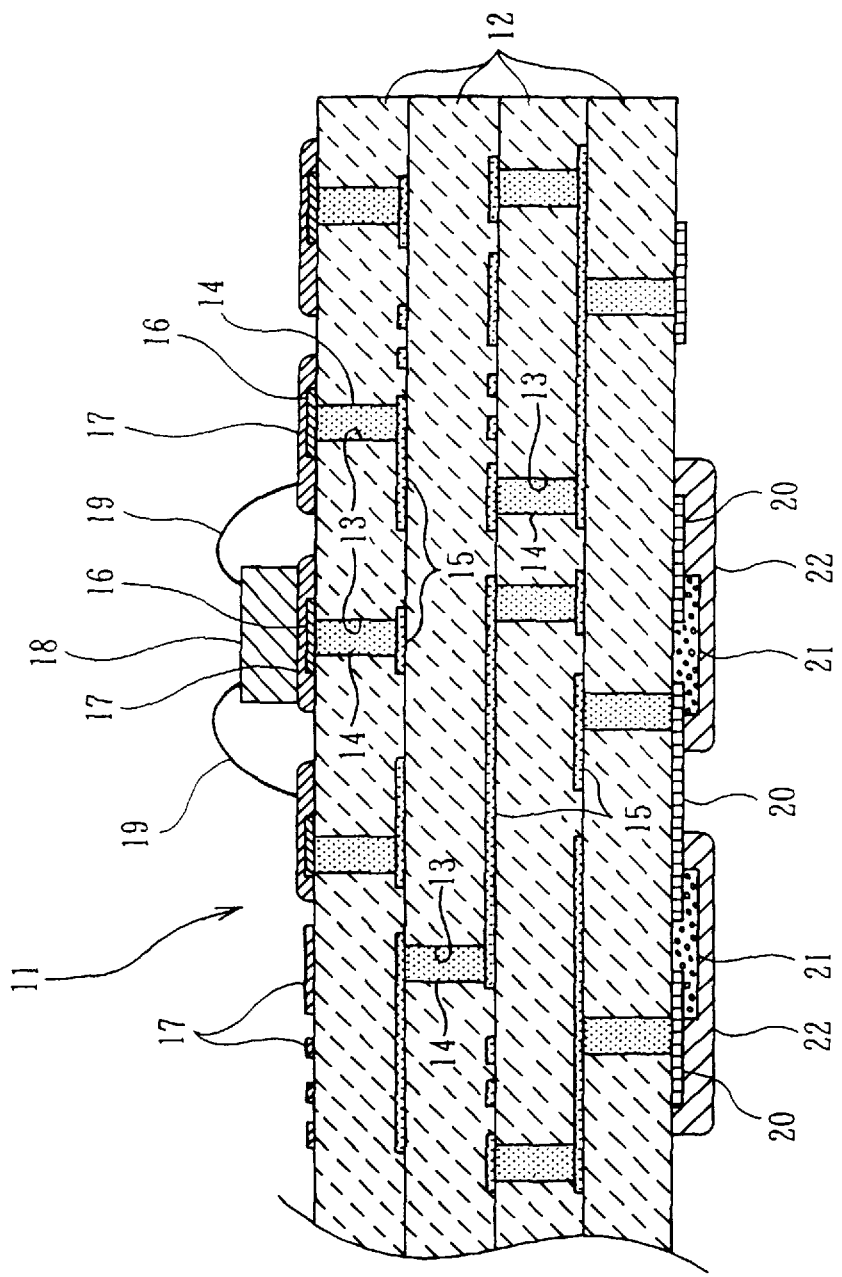
FIG. 1 is an enlarged longitudinal section of the low-temperature fired ceramic circuit substrate of one embodiment in accordance with the present invention.

One embodiment of the present invention will be described. Referring to FIG. 1, the constitution of the low-temperature fired ceramic circuit substrate of the embodiment is shown. A ceramic circuit substrate 11 is formed into a multilayer substrate by laminating a plurality of low-temperature firable green sheets 12 (insulating layers) each composed as will be described later and then by firing the laminate into an integrated circuit substrate. Each insulating layer 12 has through holes 13 formed at predetermined locations thereof by means of punching. The through holes 13 are filled with a conductor paste of Ag system or via 14 so that the layers 12 are electrically connected to one another. A pattern of inside layer wiring conductor 15 formed of the same Ag conductor paste as the via 14 is provided by means of the screen printing on the surface of each insulating layer 12 except for the surface layer. The Ag conductor vias 14 and wiring patterns 15 are co-fired with the laminate of the green sheets 12. The Ag conductor includes conductors mainly composed of Ag, such as Ag/Pd, Ag/Pt and Ag/Pd/Pt as well as that of Ag.

Intermediate metal layers 16 of Au/Ag system composed as will be described later are printed on the vias 14 exposed on the surface of the ceramic circuit substrate 11, and then the Au/Ag intermediate metal layers 16 are fired. Patterns of Au surface layer wiring conductors 17 are printed on the intermediate metal layers 16 and then fired. The Au wiring conductor includes conductors mainly composed of Au, such as Au/Pt and Au/Pd as well as that of Au. A semiconductor chip 18 is die-bonded on one of the Au wiring conductors 17. Electrodes on the upper surface of the semiconductor chip 18 are connected by bonding wires 19 such as Au wires to the other Au wiring conductors 17.

Patterns of Ag surface layer wiring conductors 20 are printed on the backside of the ceramic substrate 11 and then fired. A paste of $RuO_2$ system is further printed on the Ag surface layer wiring conductors 20 and then fired to be formed into surface layer resistors 21. Overcoat glass layers 22 are further printed on the surface layer resistors 21 and then fired.

Figure 2:
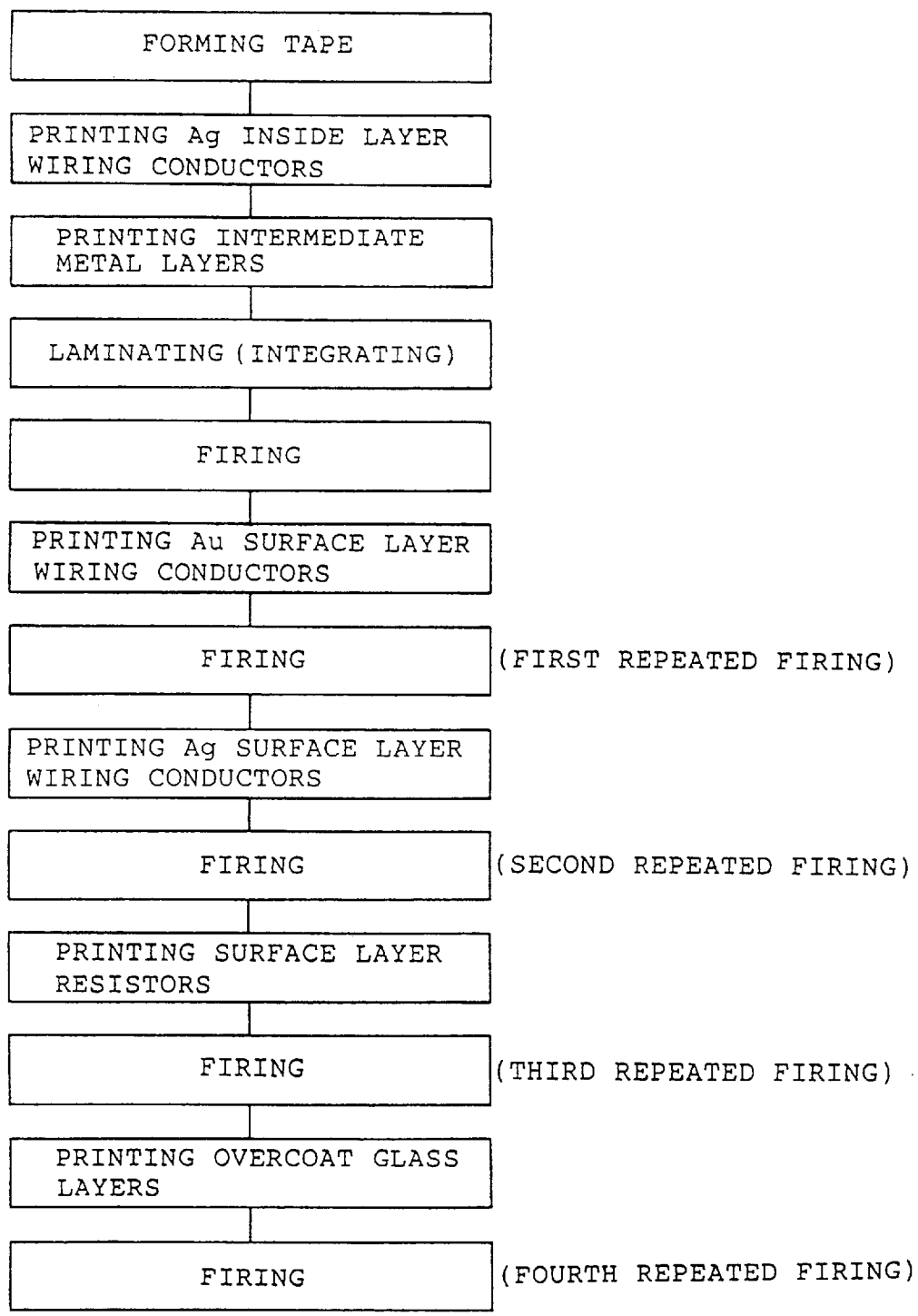
FIG. 2 is a flowchart showing an ordinary procedure for fabricating the low-temperature fired ceramic circuit substrate.

Referring now to FIG. 2, a firing order will be described. First, the Ag inside layer wiring conductors 14 and 15, and the intermediate metal layers 16 are simultaneously co-fired with the laminate of green sheets 12. Subsequently, the Au surface layer wiring conductors 17 are printed and fired (first repeated firing). Subsequently, the Ag surface layer wiring conductors 20 are printed and fired (second repeated firing). Subsequently, the surface layer resistors 21 are printed and fired (third repeated firing). Finally, the overcoat glass layers 22 are printed and fired (fourth repeated firing). The firing may be repeated five times or more when a substrate has a complicated surface wiring structure.

Fabrication of the low-temperature fired ceramic circuit substrate will be described. In making a material for the low-temperature fired ceramic, a mixture containing 10 to 55% of CaO, 45 to 70% of $SiO_2$, 0 to 30% of $Al_2O_3$, and 5 to 20% of $B_2O_3$, by weight, is melted at 1,450° C. to be vitrified. Thereafter, the vitrified mixture is rapidly quenched in water and then pulverized into a $CaO$—$Al_2O_3$—$SiO_2$—$B_2O_3$ glass powder having an average grain diameter of 3 to 3.5 μm. A ceramic insulator mixed powder is made by mixing 50 to 65% of the glass powder and 50 to 35% of alumina powder by weight having an average grain diameter of 1.0 to 2.0 μm. A solvent such as toluene or xylene, a binder such as acrylic resin, and a plasticizer such as dioctyl phosphate (DOP) are added to the mixed powder. The mixture is sufficiently blended so that a slurry having a viscosity of 2,000 to 40,000 cps is obtained. The slurry is made by a doctor blade process into a green sheet 12 having a thickness ranging between 0.1 and 0.4 mm.

Subsequently, the green sheet 12 is cut by a punch die or a punching machine into a predetermined configuration. The through holes 13 each having a diameter of 0.3 mm are formed through predetermined locations on the sheet 12 by means of punching. Each through hole 13 is filled with an Ag conductor paste serving as the inner layer wiring conductor 14. The wiring patterns 15 are formed of the same Ag conductor paste on the surface of the green sheet 12 by means of the screen printing. In the same manner as described above, the patterns of the Ag inside layer wiring conductors 14 and 15 are successively printed on a plurality of green sheets 12.

Subsequently, a thick film paste of Au/Ag conductor is screen-printed on the exposed portion of each via 14 on the surface of the green sheet 12 composing the surface layer of the ceramic substrate 11, thereby forming the intermediate metal layers 16. The Au/Ag paste is made by mixing an Au/Ag powder consisting of 10 to 80% of Au by weight and 90 to 20% of Ag by weight, a binder such as ethyl cellulose, a solvent such as terpineol. The Au/Ag powder may be an alloy powder of Au and Ag or a mixed powder of Au powder and Ag powder.

The plurality of green sheets 12 having the screen-printed Ag inside layer wiring conductors 14 and 15 and the intermediate metal layers 16 are laminated one upon another and then integrated by means of the thermocompression bonding at a temperature of 80° to 150° C. at a pressure of 50 to 250 kg/cm². Subsequently, the laminate is fired in an oxidizing atmosphere (or air) at a temperature of 800° to 1,000° C. (preferably 900° C.) for 20 minutes with a general electric continuous belt-driven furnace.

Subsequently, an Au conductor paste consisting of 100% of Au by weight is screen-printed on the surface layer of the fired substrate to be thereby formed into Au surface layer wiring conductors 17. The substrate is then fired in the air at 850° C. for 10 minutes with the general electric continuous belt-driven furnace (first repeated firing). Subsequently, an Ag conductor paste such as an Ag/Pd paste is screen-printed on the backside layer to be formed into the surface layer wiring conductors 20. The substrate is then fired in the same manner as described above (second repeated firing). An $RuO_2$ paste is screen-printed on the surface layer wiring conductors 20 to be formed into the surface resistors 21. The substrate is then fired in the same manner as described above (third repeated firing). Finally, the overcoat glass layers 22 are formed on the surface resistors 21 by the screen printing. The substrate is then fired in the same manner as described above (fourth repeated firing).

An experiment was carried out for evaluation of reliability in connections between the Ag wiring conductors or vias 14 and the Au surface layer wiring conductors 17 of the low-temperature fired ceramic circuit substrate fabricated as described above. Each connection will hereinafter be referred to as "Ag-Au connection." TABLE 1A shows compositions of sample substrates each formed with the Ag-Au connections. The sample substrates were repeatedly fired in the oxidizing atmosphere at 850° C. for 10 minutes with the general electric continuous belt-driven furnace for evaluation of the number of through holes broken due to the repeated firing. TABLE 1B shows the results of evaluation.

TABLE 1A

| Sample No. | Type of ceramic composition | Au surface layer wiring conductor (weight percentage) | Ag inside layer wiring conductor (weight percentage) | Intermediate metal layer (weight percentage) |
|---|---|---|---|---|
| 1 | A | Au (100) | Ag (100) | Au/Ag (80/20) |
| 2 | A | Au (100) | Ag (100) | Au/Ag (30/70) |

TABLE 1A-continued

| Sample No. | Type of ceramic composition | Au surface layer wiring conductor (weight percentage) | Ag inside layer wiring conductor (weight percentage) | Intermediate metal layer (weight percentage) |
|---|---|---|---|---|
| 3 | A | Au/Pt (95/5) | Ag/Pt (99/1) | Au/Ag (10/90) |
| 4 | B | Au (100) | Ag (100) | Au/Ag 10/90) |
| 5 | B | Au (100) | Ag (100) | Au/Ag (50/50) |
| 6 | B | Au (100) | Ag (100) | Au/Ag (80/20) |
| 7 | C | Au (100) | Ag/Pt (99/1) | Au/Ag (10/90) |
| 8 | C | Au (100) | Ag (100) | Au/Ag (80/20) |
| 9 | A | Au (100) | Ag (100) | Au/Ag (5/95) |
| 10 | B | Au (100) | Ag (100) | Au/Ag (90/10) |
| 11 | C | Au (100) | Ag/Pt (99/1) | Au/Ag (90/10) |
| 12 | A | Au/Pt (95/5) | Ag/Pd (90/10) | Ag/Pt (99/1) |
| 13 | B | Au (100) | Ag (100) | Ni plating Ni 100 |

TABLE 1B

| Sample No. | Number of through holes broken due to repeated firing (number of broken holes/number of all holes) | | | Expansion of holes |
|---|---|---|---|---|
| | First | Third | Seventh | |
| 1 | 0/10,000 | 0/10,000 | 0/10,000 | No |
| 2 | 0/10,000 | 0/10,000 | 0/10,000 | No |
| 3 | 0/10,000 | 0/10,000 | 0/10,000 | No |
| 4 | 0/10,000 | 0/10,000 | 0/10,000 | No |
| 5 | 0/10,000 | 0/10,000 | 0/10,000 | No |
| 6 | 0/10,000 | 0/10,000 | 0/10,000 | No |
| 7 | 0/10,000 | 0/10,000 | 0/10,000 | No |
| 8 | 0/10,000 | 0/10,000 | 0/10,000 | No |
| 9 | 0/10,000 | 0/10,000 | 18/10,000 | No |
| 10 | 5/10,000 | 10/10,000 | 39/10,000 | No |
| 11 | 9/10,000 | 15/10,000 | 47/10,000 | No |
| 12 | 10/10,000 | 15/10,000 | 56/10,000 | No |
| 13 | 0/10,000 | 22/10,000 | 68/10,000 | Yes |

The sample substrates were divided into three types, that is, types A, B and C, depending upon the ceramic composition. Each type of sample substrate is a low-temperature fired ceramic firable at or below 1,000° C. The ceramic of type A is a mixture of 60% of CaO—$Al_2O_3$—$SiO_2$—$B_2O_3$ glass by weight and 40% of alumina by weight. The ceramic of type B is a mixture of 50% of commercially available alumina-lead borosilicate glass (PbO—$Al_2O_3$—$SiO_2$—$B_2O_3$) by weight and 50% of alumina by weight. The ceramic of type C is a mixture of 60% of CaO—$Al_2O_3$—$SiO_2$—$B_2O_3$—MgO glass by weight and 40% of alumina by weight.

The Au surface layer wiring conductor of each sample substrate consists of 100% of Au by weight except for sample Nos. 3 and 12. The Au surface layer wiring conductor of each of sample Nos. 3 and 12 consists of 95% of Au and 5% of Pt by weight.

The Ag inside layer wiring conductor of each of the sample substrate Nos. 1, 2, 4–6, 8–10 and 13 consists of 100% of Ag by weight. The Ag inside layer wiring conductor of each of the sample Nos. 3, 7 and 11 consists of 99% of Ag and 1% of Pt by weight. The Ag inside layer wiring conductor of the sample substrate No. 12 consists of 90% of Ag and 10% of Pd by weight.

The intermediate metal layer of each of sample substrate Nos. 1 to 10 consists of Au/Ag. The intermediate metal layers of sample substrate Nos. 11 and 12 consist of Ag/Pd and Ag/Pt respectively. The sample substrate No. 13 includes an intermediate metal layer composed by nickel (Ni) plating, showing the prior art such as disclosed in Japanese Patent Publication No. 5(1993)-69319.

The above-described sample substrates were fired repeatedly. Regarding sample Nos. 1 to 8, no expansion was found and none of 10,000 through holes were broken even after the firing had been repeated seven times. This confirmed that the intermediate metal layer (Au/Ag layer) greatly improved the reliability in the Ag-Au connection against the repeated firing. A mixture of 10 to 80% of Au by weight and 90 to 20% of Ag by weight was required to obtain the above-described high reliability in the Ag-Au connection.

Regarding sample substrate No. 9, the intermediate metal layer contained 5% of Au by weight though composed of Au/Ag. Accordingly, sample No. 9 was lower in the effect of connection by the intermediate metal layer than sample Nos. 1 to 8. Even in sample No. 9, however, no expansion was found and none of the through holes were broken when the firing had been repeated three times. Thus, sample substrate No. 9 improved the reliability in the Ag-Au connection against the repeated firing as compared with the prior art (sample No. 13).

The intermediate metal layer of sample substrate No. 10 contained 90% of Au by weight though composed of Au/Ag. Since sample No. 10 contained an excessive amount of Au, the effect of connection by the intermediate metal layer was lowered. Accordingly, even the first repeated firing broke five through holes, resulting in slight failure in connection. In even sample No. 10, however, the number of broken through holes was smaller than in the prior art (sample No. 13) when the firing had been repeated thrice or more. Thus, the effect of connection by the intermediate metal layer of Au/Ag was confirmed even in sample No. 10.

The intermediate metal layers of sample substrate Nos. 11 and 12 contained Ag/Pd and Ag/Pt respectively. The effect of connection by the intermediate metal layer is low in each of these samples. Accordingly, the first repeated firing broke nine through holes in sample No. 11 and ten through holes in sample No. 12, resulting in failure in connection.

Sample No. 13 representative of the prior art included the intermediate metal layer composed by the nickel plating. The first repeated firing broke none of 10,000 through holes. However, as the number of times of repeated firing was increased, the number of broken through holes was rendered larger and the reliability in the Ag-Au connection against the repeated firing was rendered lower.

FIG. 1 shows the low-temperature fired ceramic circuit substrate having the Au surface layer wiring conductors 17 formed only on the surface of the substrate with the Au/Ag intermediate metal layers 16 being interposed therebetween. Such Au surface layer wiring conductors may be formed on both of the surface and the backside of the substrate with the intermediate metal layers being interposed therebetween.

The intermediate metal layers 16 are co-fired with the laminate of the Ag inside layer wiring conductors 15 and the green sheets 12 in the foregoing embodiment. The intermediate metal layers 16 may be printed and fired after the laminate of the Ag inside layer wiring conductors 15 and the green sheets 12 have been co-fired.

The Au/Ag conductor forming each intermediate metal layer 16 may contain a small amount of conductors other than Au and Ag. Furthermore, the number of green sheets (insulating layers) 12 composing the laminate may be changed.

The foregoing description and drawings are merely illustrative of the principles of the present invention and are not to be construed in a limiting sense. Various changes and modifications will become apparent to those of ordinary skill in the art. All such changes and modifications are seen to fall within the true spirit and scope of the invention as defined by the appended claims.

We claim:

1. A low temperature fired ceramic circuit substrate comprising:
    a plurality of laminated insulating layers each formed of a low-temperature fired ceramic fired at a temperature ranging between 800° and 1,000° C., the insulating layers including at least one inside insulating layer and at least one surface insulating layer;
    an inside layer wiring conductor formed of a conductive material of Ag system which is mainly composed of Ag, the inside layer wiring conductor being disposed in the inside insulating layer;
    a surface layer wiring conductor formed of a conductive material of Au system which is mainly composed of Au, the surface layer wiring conductor being disposed on the surface insulating layer; and
    an intermediate metal layer formed of a thick film paste of a conductive material of Au/Ag system which is mainly composed of Au/Ag, wherein said Au/Ag system is an allow powder of Au and Ag or a mixed powder of Au powder and Ag powder, the intermediate metal layer being interposed between the inside layer wiring conductor and the surface layer wiring conductor said intermediate metal layer contacting said inside and surface layer wiring conductors.

2. A low-temperature fired ceramic circuit substrate according to claim 1, wherein the Au/Ag conductive material contains 10 to 80 weight percentage of Au and 90 to 20 weight percentage of Ag.

3. A low-temperature fired ceramic circuit substrate according to claim 1, wherein the Ag conductive material consists of Ag, Ag/Pd, Ag/Pt or Ag/Pd/Pt.

4. A low-temperature fired ceramic circuit substrate according to claim 1, wherein the Au conductive material consists of Au, Au/Pt or Au/Pd.

5. A low-temperature fired ceramic circuit substrate according to claim 1, wherein the low-temperature fired ceramic substantially consists of a mixture of a glass powder of $CaO—Al_2O_3—SiO_2—B_2O_3$ system and an alumina powder.

6. A low-temperature fired ceramic circuit substrate according to claim 1, wherein the plurality of insulating layers, the inside layer wiring conductor and the intermediate metal layer are simultaneously fired and thereafter, the surface layer wiring conductor is printed on the intermediate metal layer to be fired.

7. A low-temperature fired ceramic circuit substrate according to claim 1, wherein the plurality of insulating layers and the inside layer wiring conductor are simultaneously fired and thereafter, the intermediate metal layer is printed on the inside layer wiring conductor to be fired.

8. A low temperature fired ceramic circuit substrate according to claim 1, wherein the low-temperature fired ceramic substantially consists of a mixture of a glass powder of $PbO—Al_2O_3—SiO_2—B_2O_3$ and an alumina powder.

9. A low temperature fired ceramic circuit substrate according to claim 1, wherein the low-temperature fired ceramic substantially consists of a mixture of a glass powder of $CaO—Al_2O_3—SiO_2—B_2O_3—MgO$ and an alumina powder.

* * * * *